United States Patent
Robinson

(10) Patent No.: US 10,505,246 B2
(45) Date of Patent: Dec. 10, 2019

(54) CORONA PREVENTION IN RADIO FREQUENCY CIRCUITS

(71) Applicant: Lockheed Martin Corporation, Bethesda, MD (US)

(72) Inventor: Kevin L. Robinson, Clay, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 200 days.

(21) Appl. No.: 15/239,942

(22) Filed: Aug. 18, 2016

(65) Prior Publication Data
US 2018/0053980 A1  Feb. 22, 2018

(51) Int. Cl.
*H01P 1/38* (2006.01)
*B03C 3/00* (2006.01)
*H05K 3/28* (2006.01)
*H05K 1/02* (2006.01)

(52) U.S. Cl.
CPC .......... *H01P 1/38* (2013.01); *B03C 3/00* (2013.01); *H05K 3/28* (2013.01); *H05K 1/0256* (2013.01); *H05K 1/0259* (2013.01)

(58) Field of Classification Search
CPC .... H01P 1/38; B03C 3/00; H05K 3/28; H05K 1/0256; H05K 1/0259
USPC ........................................................ 427/58
See application file for complete search history.

(56) References Cited

U.S. PATENT DOCUMENTS

| | | | |
|---|---|---|---|
| 6,485,659 B1* | 11/2002 | Goedde | H01B 3/20 174/17 LF |
| 7,863,522 B2 | 1/2011 | Han et al. | |
| 8,716,606 B2 | 5/2014 | Kelley et al. | |
| 2006/0225274 A1* | 10/2006 | Greenberg | A61N 1/0543 29/846 |
| 2007/0197051 A1* | 8/2007 | Cravey | B01D 17/06 438/800 |
| 2008/0217793 A1 | 9/2008 | Choudhary et al. | |
| 2009/0273410 A1* | 11/2009 | Arakawa | H01P 1/36 333/24.2 |
| 2010/0036038 A1* | 2/2010 | Rodgers | B60C 1/0008 524/445 |
| 2010/0181094 A1 | 7/2010 | Duarte Pena | |
| 2014/0330056 A1* | 11/2014 | Klosin | C08F 10/00 585/17 |
| 2015/0206624 A1* | 7/2015 | Choi | H01B 7/292 174/120 C |

(Continued)

FOREIGN PATENT DOCUMENTS

CN    204361237 U  *  5/2015
JP    04255612 A   *  9/1992

OTHER PUBLICATIONS

Kobayashi, S., JP-04255612-A, Machine Translation, originally published 1992, p. 1-7 (Year: 1992).*

(Continued)

*Primary Examiner* — Katherine A Bareford
*Assistant Examiner* — Christina D McClure
(74) *Attorney, Agent, or Firm* — Howard IP Law Group

(57) ABSTRACT

A method for preventing corona effects in an electronic circuit comprising the steps of applying a parylene coating to a surface of the electronic circuit, and applying a poly-alphaolefin dielectric oil having a dielectric constant that is lower than that of the parylene coating on an exposed surface of the first material.

14 Claims, 4 Drawing Sheets

(56) References Cited

U.S. PATENT DOCUMENTS

2016/0028139 A1 1/2016 Cruickshank et al.

OTHER PUBLICATIONS

Zhang, W., CN-204361237-U, Machine Translation, originally published, 2015, p. 1-6 (Year: 2015).*
International Search Report and Written Opinion of the International Searching Authority, issued in related PCT/US2017/047559, dated Oct. 25, 2017.

* cited by examiner

| | Parylene Thickness (mils) | RTV 615 Electric Field Strength Maximum (MV/m) | RTV 615 Electric Field Strength Maximum (V/mil) | RTV 615 Safety Factor | Parylene Electric Field Strength Maximum (MV/m) | Parylene Safety Factor | PAO Electric Field Strength Maximum (MV/m) | PAO Safety Factor |
|---|---|---|---|---|---|---|---|---|
| Conventional Potting Schemes | N/A | 11.8 | 299.7 | 1.67 | N/A | N/A | N/A | N/A |
| Parylene/PAO | .5 + .5 + 2.0 fill | N/A | N/A | N/A | 8.7 | 31.68 | 5.5 | 2.51 |

| | |
|---|---|
| RTV 615 rating | 19.7 | 500.0 |
| Dry air rating | 3.0 | 76.2 |
| Parylene rating | 275.6 | 7000.3 |
| PAO rating | 13.8 | 350.0 |

*Fig. 6*

CORONA PREVENTION IN RADIO FREQUENCY CIRCUITS

FIELD OF THE INVENTION

The present invention relates to inhibiting the formation or initiation of corona in high power circuits.

BACKGROUND OF THE INVENTION

Corona initiation and eventual corona discharge in circuits, for example high power radio frequency (RF) circuits, represents a fundamental power handling limitation. Electric field strengths responsible for corona initiation depend on the material voltage breakdown of the isolating dielectric material(s) used, as well as the circuit geometry and associated dielectric discontinuities. These factors can create electric field strength multipliers which eventually induce corona effects.

Insulating potting compounds have been applied to high voltage circuits or circuit assemblies to improve their ability to withstand higher voltages and thus, higher electric field strengths for reducing detrimental corona effects. Common potting compounds, for example silicon rubber (e.g. MG Chemicals Momentive™ RTV615), have dielectric strengths of about 500 volts per mil (V/mil), with air being 78 V/mil. Methods for preventing corona initiation in circuits requiring even higher voltage handling capability often include increasing the physical size of circuit components, thus maintaining the electric field strengths despite the presence of higher voltages. However, in some applications, the size of relevant components may be restricted for any number of reasons including space constraints and/or performance considerations. One such example includes RF circulators used in modern radar applications, where the thickness of ferrite materials utilized therein cannot be increased indefinitely. In particular, their size may be constrained by the potential for additional modes of propagation within the circulator, which may be destructive or otherwise detrimental to the performance of the circuit.

FIG. 1 provides a simplified cross-section view of an exemplary circulator assembly 10, including ferrites or garnets 12 and associated circuitry 14. During production, these components may be arranged within a hermetically-sealable housing or enclosure 16. A potting compound 18 (e.g. silicon rubber) is used to fill in any void space created within enclosure 16 prior to its sealing. This space includes indicated junction areas A, wherein charged circuitry 14 meets a combination of high and low dielectric materials leading to elevated electric field strengths. As the size of garnets 12 and associated circuitry 14 is constrained for the reasons set forth above, the effectiveness of potting compound 18 is the limiting factor for controlling electric field strengths, and thus, for preventing corona initiation and subsequent discharge.

Alternative solutions for preventing corona effects include constructing circuit assemblies with components having dielectric constants that are nearly equal throughout, mitigating or eliminating electric field strength multiplication factors, and more uniformly distributing the formation of any electric fields. However, these solutions are ineffective for high power RF circulators, as there are currently no potting materials with dielectric constants matching those of the ferrites or garnets (approximately 16) used in circulator applications.

Accordingly, alternative systems and methods for prevention of corona initiation, and circuits utilizing the same, are desired.

SUMMARY

In one embodiment of the disclosure a method for preventing corona initiation in an electronic circuit is provided. The method includes the steps of applying a first polymer material, such as a parylene coating having a first dielectric strength, to a surface of the electronic circuit. The electronic circuit is arranged within a housing or enclosure, wherein a second coating of the first polymer material may be applied to exposed surfaces within the enclosure. A second polymer material, such as a polyalphaolefin (PAO) dielectric oil having a second dielectric strength that is lower than the dielectric strength of the first material, is used to fill a remainder of the enclosure.

In another embodiment of the disclosure, an electrically insulated electrical circuit assembly is provided. The assembly includes a hermetically sealed enclosure having at least one electronic circuit element contained therein. The at least one circuit element comprises a first polymer material (e.g. a parylene coating) applied to an exterior or exposed surface thereof. A remainder of an interior volume of the enclosure contains a second polymer material, such as a PAO dielectric oil.

BRIEF DESCRIPTION OF THE DRAWINGS

The invention is best understood from the following detailed description when read in connection with the accompanying drawings. The various features of the drawings are not specified exhaustively. On the contrary, the various features may be arbitrarily expanded or reduced for clarity. Included in the drawing are the following figures:

FIG. 6 is a table showing characteristics of an embodiment of the present disclosure in relation to conventional potting schemes.

DETAILED DESCRIPTION

Figure 1:
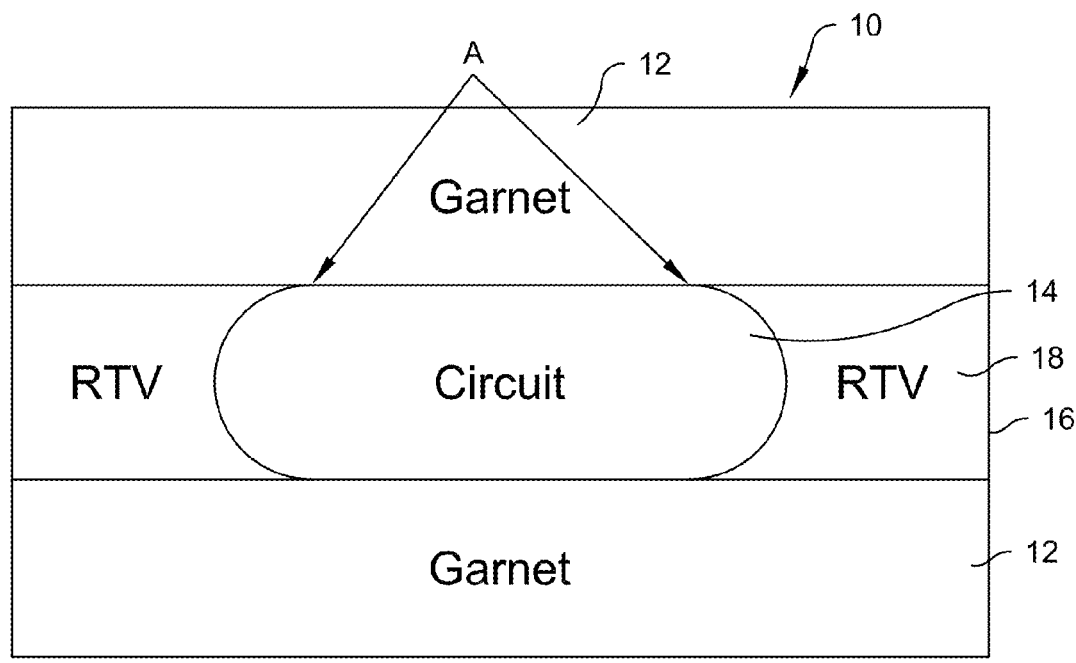
FIG. 1 is a cross-section view of a simplified RF circulator potted with a single silicon material.

It is to be understood that the figures and descriptions of the present invention have been simplified to illustrate elements that are relevant for a clear understanding of the present invention, while eliminating, for purposes of clarity, many other elements found in electronic circuits, such as high power circulators used in RF applications. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure include a method of potting an electrical circuit for reducing electric field strengths. The method includes placing a first material of relatively high dielectric strength in areas of a circuit subject to the highest electric field strength, for example, at junctions wherein a charged circuit meets a combination of high and low dielectric materials. The first material may comprise a polymer coating, such as parylene or poly-para-xylylene. In one embodiment parylene C, comprising a dielectric strength of approximately 7,000 V/mil and a dielectric constant of 2.3, may be used. Preferably, the first material comprises a high dielectric strength, as well as the ability to adhere to critical circuit features (e.g. garnets, copper circuit tracing and silver plating). Alternative conforming coatings include urethanes and silicone rubbers, however, these materials provide lower dielectric strength and higher dielectric loss. This material may be applied to one or more exterior surfaces of an electrical circuit by a chemical deposition process, by way of example only.

A second material of a lower dielectric strength, such as a polymer-based dielectric liquid, is applied in lower electric field strength locations, or more generally, applied over the first material. In one embodiment, this may include filling a remaining void space of an enclosure containing a circuit coated with the first material with the second material. In one embodiment, the second material may comprise a poly-alphaolefin (PAO) based material. An exemplary PAO may be embodied as a dielectric oil comprising a dielectric strength of approximately 500 V/mil and a dielectric constant of approximately 2.1. The second material, or fill dielectric material, should comprise a high dielectric strength, and should be inert so as not react chemically with the first material. While a PAO base material may be preferred, other high voltage dielectric oils may be used. However, these alternatives are generally more caustic and harder to dispose of properly. Moreover, as the dielectric constant of PAO is a close match to that of parylene, reductions in electric field strength multiplication in the material may be realized over materials with more disparate dielectric constants. PAOs and other dielectric oils are also particularly advantageous in that they do not harden or cure, and thus, do not risk bonding to the first dielectric material (e.g. the parylene coating). In this way, detrimental effects encountered using traditional potting materials, including the pulling of the parylene coating off of the circuit components during the curing process, are avoided.

Figure 2:
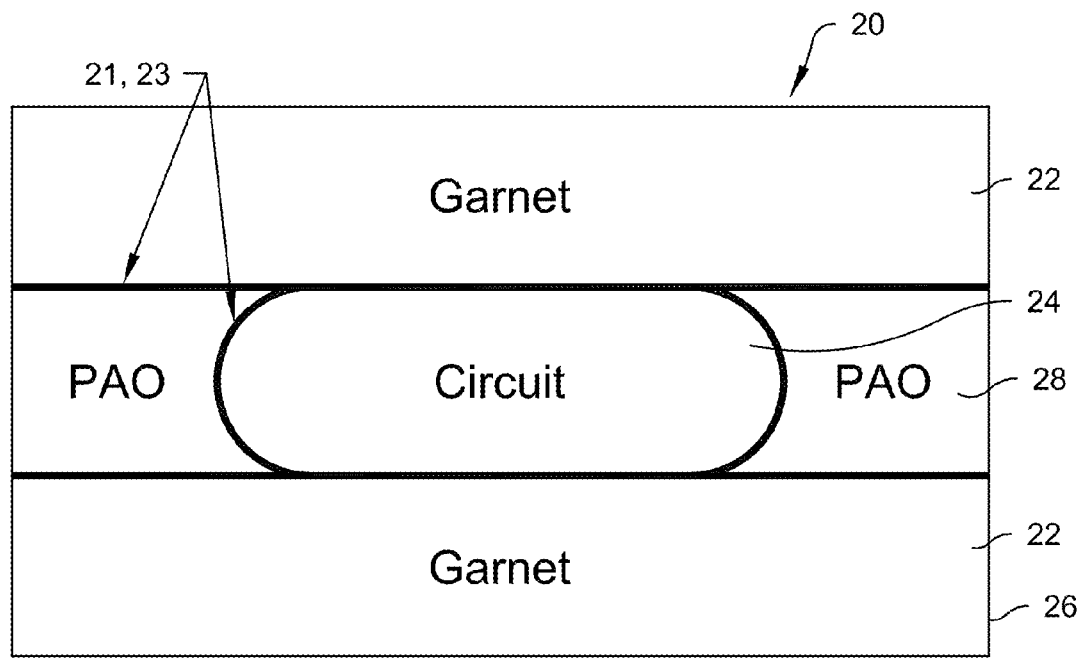
FIG. 2 is a cross-section view of a simplified RF circulator utilizing a multi-material potting scheme according to embodiments of the present disclosure.

Referring generally to FIG. 2, a simplified RF circulator 20 potted according to an embodiment of the presented disclosure is shown. During a production process of circulator 20, a parylene coating may be applied on one or more exposed or exterior surfaces of the circulator assembly or circulator components. These components may include, for example, a control circuit 24 and associated ferrimagnet garnets or ferrites 22. These components may be coated individually prior to the assembly of the circuit, and/or after they have been arranged within an associated circuit housing or enclosure 26. In one exemplary embodiment, an initial or first parylene coating 21 is applied on the order of 0.1 to 3 mils or more by a chemical vapor deposition process. In one particularly advantageous embodiment, a parylene coating having a thickness of 0.5 mil is applied. Once coated, circuit components may be arranged within enclosure 26, after which a second parylene coating 23 may be applied to exposed surfaces of the circuit components and/or enclosure 26 via, for example, a back filling operation. In one embodiment, second parylene coating or back fill 23 is applied on the order of 2 mils. A liquid PAO material 28 may then be added within enclosure 26. In one embodiment, PAO material 28 is added until a remaining void space within enclosure 26 is filled, thus removing or displacing any air contained therein. Once filled, enclosure 26 may be hermetically sealed.

Figure 3:
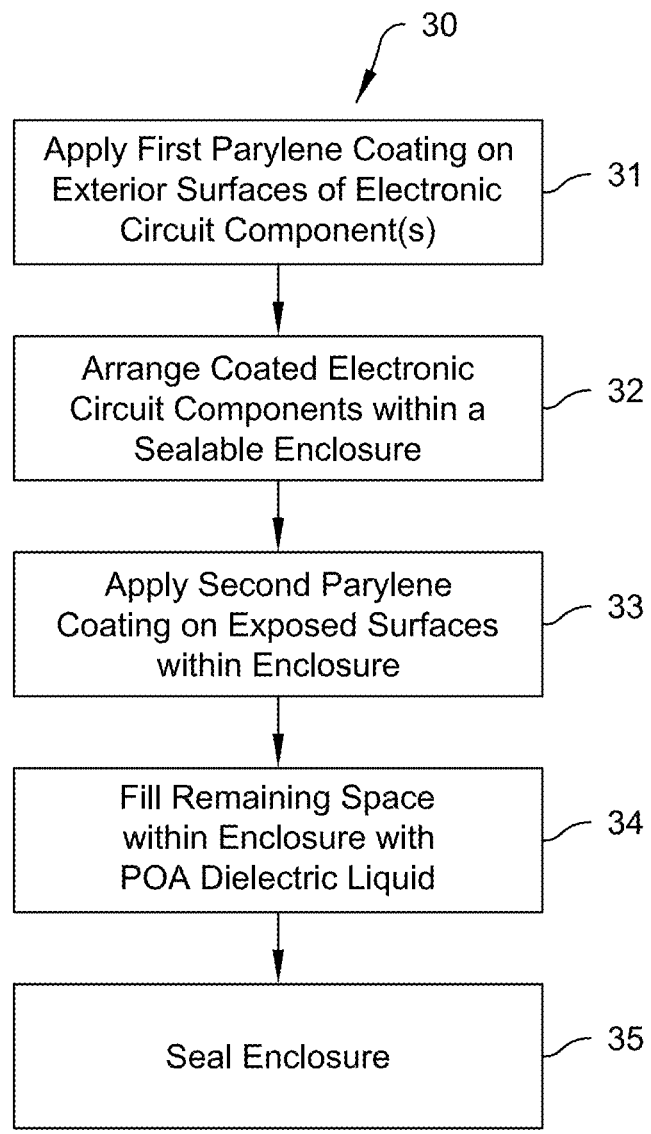
FIG. 3 is a simplified process diagram illustrating a method of potting a circuit according to an embodiment of the present disclosure.

Referring generally to FIG. 3, an exemplary method 30 of potting an electrical circuit according to an embodiment of the disclosure includes the steps of applying 31 a first or initial coating of a polymer material, such as a first parylene coating having a first dielectric strength, to a surface of an electronic circuit. Once coated, the circuit is arranged 32 within a sealable enclosure, after which a second coating of polymer material (e.g. a second parylene coating) is applied 33 to exposed surfaces within the enclosure. After the second coating is applied, a remaining void space defined within the enclosure is filled 34 with a second polymer material, such as a PAO dielectric oil having a second dielectric strength that is lower than dielectric strength of the first material. Finally, the enclosure is sealed 35 by, for example, solder sealing or hermetic laser welding.

Figure 4:
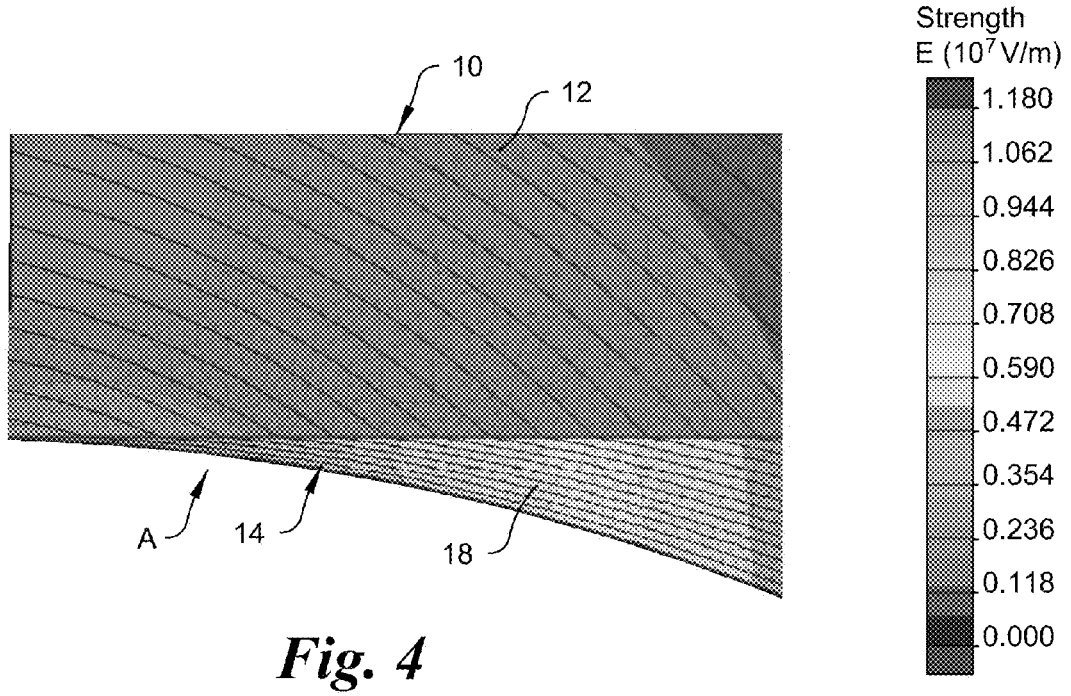
FIG. 4 is a graphical illustration of resulting electric field strengths of a circulator utilizing a potting scheme of the prior art.
Figure 5:
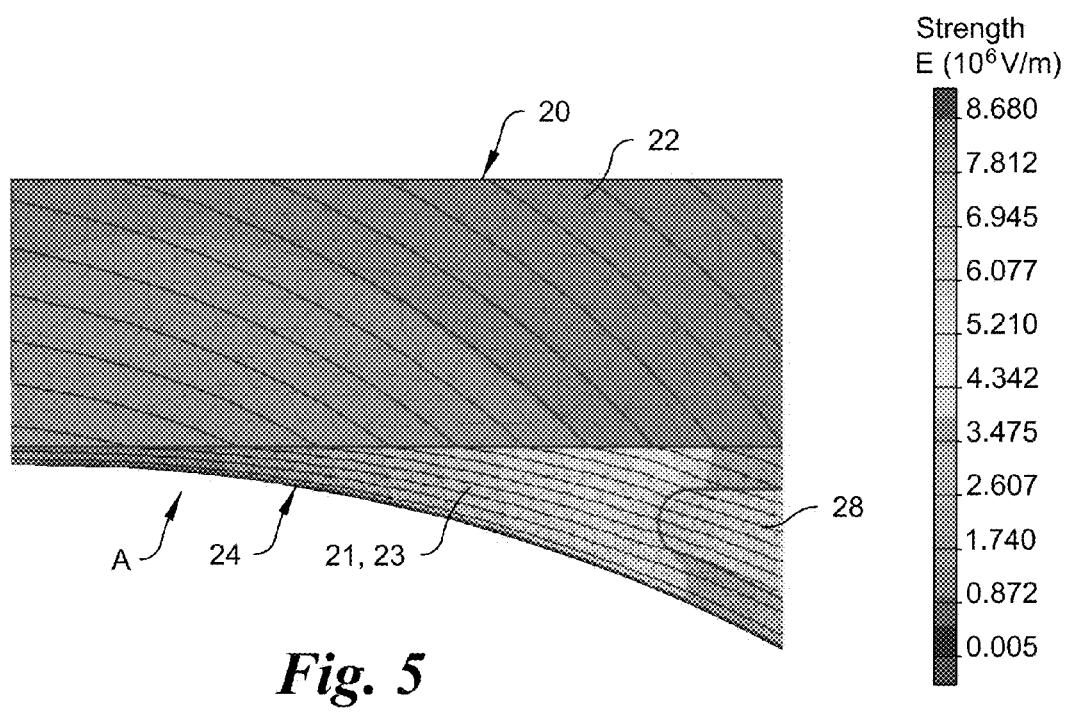
FIG. 5 is a graphical illustration of resulting electric field strengths of a circulator utilizing a potting scheme according to embodiments of the present disclosure.

Referring generally to FIGS. 4-6, advantages of embodiments of the present disclosure will be described. FIG. 4 comprises a partial view of circulator assembly 10 of FIG. 1, including simulated electric field strengths generated during normal operation thereof. As shown, area or region A between an edge of circuit 14 and garnet 12 normally associated with high electric field strengths due to the above-described field strength multipliers experiences an electric field strength of approximately 11.8 MV/m when the circulator is potted using a conventional silicon material 18 (e.g. RTV615). FIG. 5 illustrates simulated electric field strengths in the same region A between an edge of circuit 24 and garnet 22 of circulator assembly 20 of FIG. 2 which has been potted using methods according to embodiments of the present disclosure. As shown, electric field strengths in the region of one or more parylene coatings 21,23 is reduced to approximately 8.7 MV/m, and further reduced to approximately 5.5 MV/m in the dielectric oil 28 (e.g. PAO) fill. These results are further quantified in Table 1 of FIG. 6. As shown, a resulting 50% increase in the factor of safety of an exemplary circulator is realized using potting schemes according to embodiments of the present disclosure compared to that achieved by existing silicone rubber potting processes.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A method for preventing corona effect in a circulator including an electronic circuit with at least one of garnets or ferrites comprising the steps of:
   applying a first polymer material having a first dielectric strength on a surface of the electronic circuit;
   applying a second polymer material comprising a polyalphaolefin (PAO) dielectric oil having a second dielectric strength that is lower than the first dielectric strength of the first polymer material, on exposed surfaces of the first polymer material.

2. The method of claim 1, wherein the first polymer material comprises a parylene coating applied on the surface of the electronic circuit.

3. The method of claim 2, wherein the parylene coating has a dielectric strength of approximately 7,000 volts per mil (V/mil).

4. The method of claim 1, wherein the dielectric oil comprises a dielectric strength of approximately 500 volts per mil (V/mil).

5. The method of claim 1, wherein the first polymer material is applied on a surface of garnets of the circulator.

6. The method of claim 1, further comprising the step of arranging the electronic circuit within a housing.

7. The method of claim 6, wherein the step of applying a first polymer material on a surface of the electronic circuit comprises the steps of:
   applying a first coating of the first polymer material on a surface of the electronic circuit; and
   applying a second coating of the first polymer material on at least one of the first coating of the first polymer material and a surface of the electronic circuit after the circuit is arranged within the housing.

8. The method of claim 7, wherein the second coating of the first polymer material is applied on garnets of the circulator after the circulator is arranged within the housing.

9. The method of claim 6, wherein the second polymer material is applied by filling a remaining volume of the housing with the second polymer material.

10. The method of claim 9, further comprising the step of hermetically sealing the housing from an external environment.

11. A method for preventing corona effect in a circulator including an electronic circuit with at least one of garnets or ferrites comprising the steps of:
    applying a first coating of a first polymer material having a first dielectric strength on a surface of the electronic circuit;
    arranging the electronic circuit within an enclosure after applying the first coating of the first polymer material;
    applying, after arranging of the electronic circuit within the enclosure, a second coating of the first polymer material to exposed surfaces within the enclosure;
    applying a second polymer material comprising a polyalphaolefin (PAO) dielectric oil having a second dielectric strength that is lower than the first dielectric strength of the first polymer material, on exposed surfaces of the first polymer material within the enclosure.

12. The method of claim 11, wherein the first polymer material comprises a parylene coating applied on the surface of the electronic circuit.

13. The method of claim 12, wherein the parylene coating has a dielectric strength of approximately 7,000 volts per mil (V/mil).

14. The method of claim 13, wherein the dielectric oil comprises a dielectric strength of approximately 500 volts per mil (V/mil).

* * * * *